(12) United States Patent
Chang et al.

(10) Patent No.: US 7,482,280 B2
(45) Date of Patent: Jan. 27, 2009

(54) METHOD FOR FORMING A LITHOGRAPHY PATTERN

(75) Inventors: Ching-Yu Chang, Yilang County (TW); Chin-Hsiang Lin, Hsin-Chu (TW); Burn Jeng Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 152 days.

(21) Appl. No.: 11/426,233

(22) Filed: Jun. 23, 2006

(65) Prior Publication Data
US 2007/0037410 A1    Feb. 15, 2007

Related U.S. Application Data

(60) Provisional application No. 60/708,208, filed on Aug. 15, 2005.

(51) Int. Cl.
*H01L 21/302* (2006.01)
*G03F 7/00* (2006.01)

(52) U.S. Cl. .................. 438/725; 430/311; 430/312; 430/330; 257/E21.026; 257/E21.027

(58) Field of Classification Search ............. 438/708, 438/947, 946, 424, 695, 696, 780, 725; 430/312, 430/313, 311
See application file for complete search history.

(56) References Cited

U.S. PATENT DOCUMENTS

| | | | | |
|---|---|---|---|---|
| 4,426,247 A | * | 1/1984 | Tamamura et al. | 438/702 |
| 5,858,620 A | * | 1/1999 | Ishibashi et al. | 430/313 |
| 6,492,075 B1 | * | 12/2002 | Templeton et al. | 430/5 |
| 6,576,562 B2 | * | 6/2003 | Ohuchi et al. | 438/725 |
| 6,593,063 B1 | * | 7/2003 | Tanaka et al. | 430/311 |
| 7,314,691 B2 | * | 1/2008 | Hata et al. | 430/14 |
| 2002/0036183 A1 | * | 3/2002 | Shibata | 216/44 |
| 2002/0064958 A1 | * | 5/2002 | Takeuchi | 438/695 |
| 2003/0134231 A1 | * | 7/2003 | Tsai et al. | 430/312 |
| 2004/0033445 A1 | * | 2/2004 | Lee et al. | 430/313 |
| 2005/0260848 A1 | * | 11/2005 | Sreenivasan | 438/637 |

OTHER PUBLICATIONS

Sang-Jin Park et al., "Chemically Amplified Silicon Containing Resist for Electron Beam Lithography", Journal of the Korean Physical Society, vol. 35, Dec. 1999, pp. S725-S728.

Jorg Rottstegge et al., "Ultra thin film imaging at 157 nm", Infineon Technologies AG, Polymer Materials and Technology, Erlangen, Germany, 9 pages.

(Continued)

*Primary Examiner*—W. David Coleman
*Assistant Examiner*—Shaka Scarlett
(74) *Attorney, Agent, or Firm*—Haynes and Boone, LLP

(57) ABSTRACT

A method of lithography patterning includes forming a first material layer on a substrate, the first material layer being substantially free of silicon, and forming a patterned resist layer including at least one opening therein above the first material layer. A second material layer containing silicon is formed on the patterned resist layer and an opening is formed in the first material layer using the second material layer as a mask.

8 Claims, 6 Drawing Sheets

OTHER PUBLICATIONS

Mark Somervell, "Background on Thin Layer Imaging", 9 pages.

Qinghuang Lin et al., "A High Resolution 248 nm Bilayer Resist", IBM Yorktown Heights, NY, Part of the SPIE Conference on Advances in Resist Technology and Processing XVI, Santa Clara, California, Mar. 1999, SPIE, vol. 3678, 0277-786X/99, 1 page.

Katherina Babich et al., "Effects of underlayer on performance of bilayer resists for 248nm lithography", IBM Yorktown Heights, NY, SPIE vol. 3333, 1 page (726).

Carl R. Kessell et al., "Novel Silicon-Containing Resists for EUV and 193 nm Lithography", 3M Company, St. Paul, Minnesota, Part of the SPIE Conference on Advances in Resist Technology and Processing XVI, Santa Clara, California, Mar. 1999, SPIE, vol. 3678, 0277-786X/99, 1 page.

Ratnam Sooriyakumaran et al., "Positive Layer Resists for 248 and 198 nm Lithography", IBM Almaden Research Center, San Jose, California, SPIE, vol. 3333, p. 219, 0277-786/X/98.

Sergei V. Postnikov et al., "Top Surface Imaging Through Silylation", Dept. of Chemical Engineering, The University of Texas at Austin, Austin, Texas, SPIE vol. 3333, p. 997, 0277-786X/98.

* cited by examiner

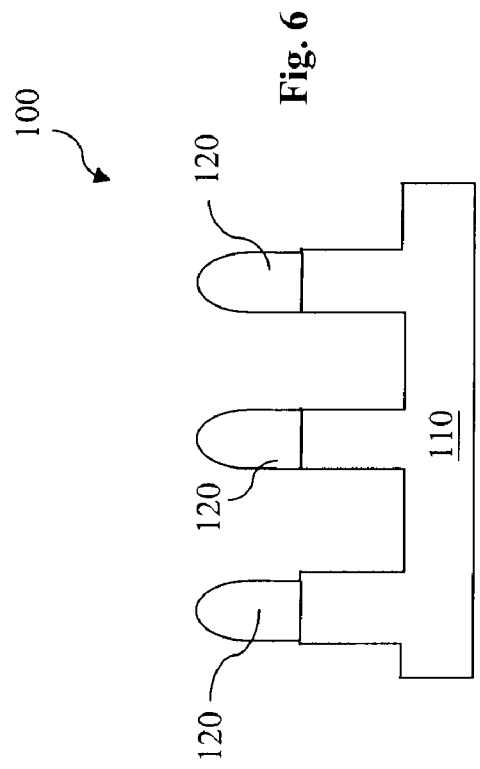
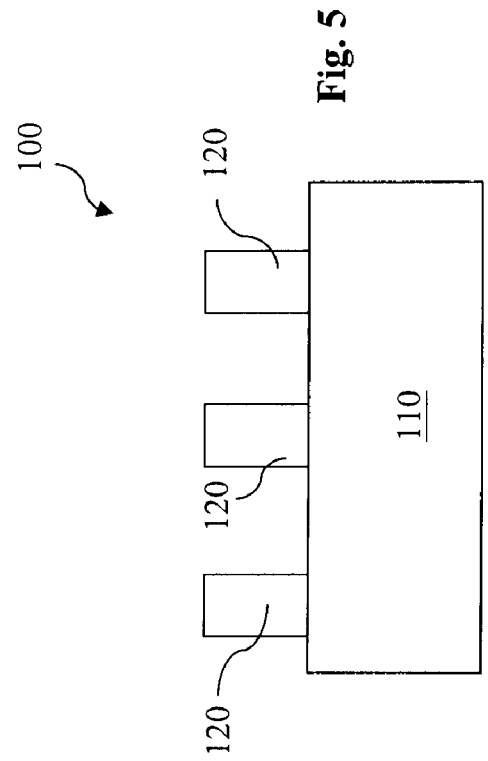

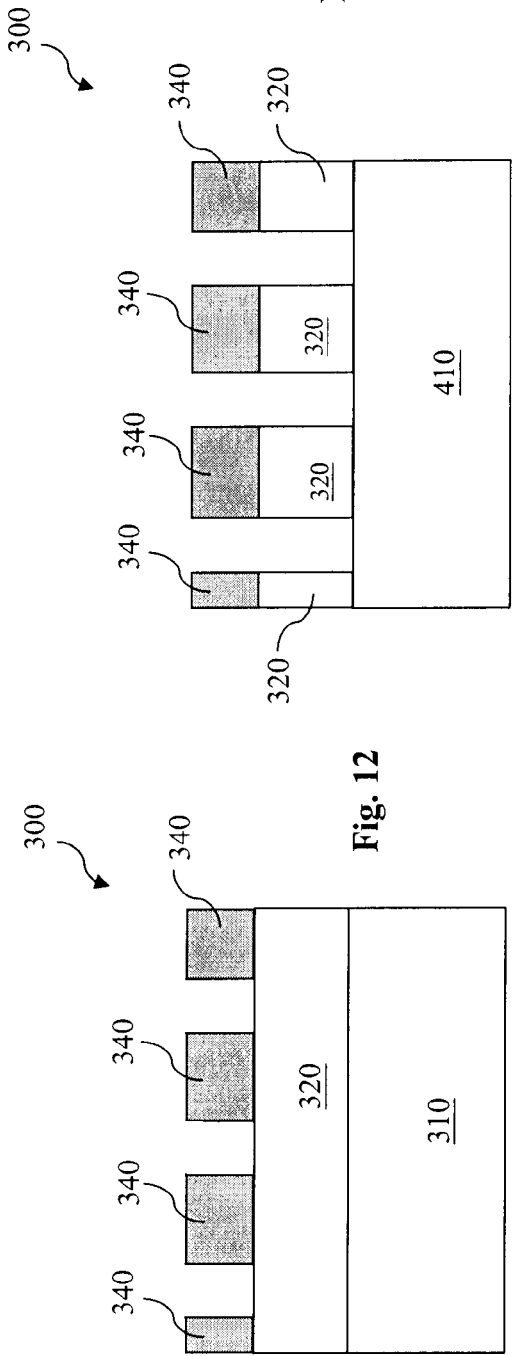

US 7,482,280 B2

METHOD FOR FORMING A LITHOGRAPHY PATTERN

CROSS REFERENCES

This application claims the benefit of U.S. Ser. No. 60/708,208 filed Aug. 15, 2005, the disclosure of which is hereby incorporated by reference.

The present disclosure is related to the following commonly-assigned U.S. patent applications, the entire disclosures of which are hereby incorporated herein by reference: U.S. patent application Ser. No. 11/152,559, entitled "METHOD FOR FORMING AN ANTI-ETCHING SHIELDING LAYER OF RESIST PATTERNS IN SEMICONDUCTOR FABRICATION," having Chin-Hsiang Lin and Ching-Yu Chang named as inventors.

BACKGROUND

Semiconductor technologies are continually progressing to smaller feature sizes, down to 65 nanometers, 45 nanometers, and below. A patterned resist layer used to produce such small feature sizes typically have a high aspect ratio. Maintaining a desired critical dimension (CD) can be very difficult for various reasons. For example, a resist layer usually has poor etching resistance and shows CD degradation during a lithography patterning process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1, 2, 3, 4, 5, and 6 illustrate sectional views of one embodiment of a substrate during various fabrication stages.

FIGS. 8, 9, 10, 11, 12, 13, and 14 illustrate sectional views of another embodiment of a substrate during various fabrication stages.

DETAILED DESCRIPTION

Figure 2:
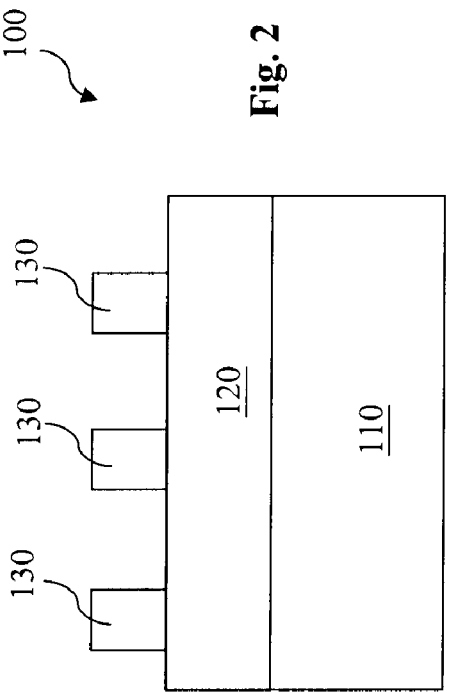

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed interposing the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIGS. 1-6 are sectional views of one embodiment of a substrate 200 during various fabrication stages. With reference to FIGS. 1-6, a method for lithography patterning is described.

Figure 1:
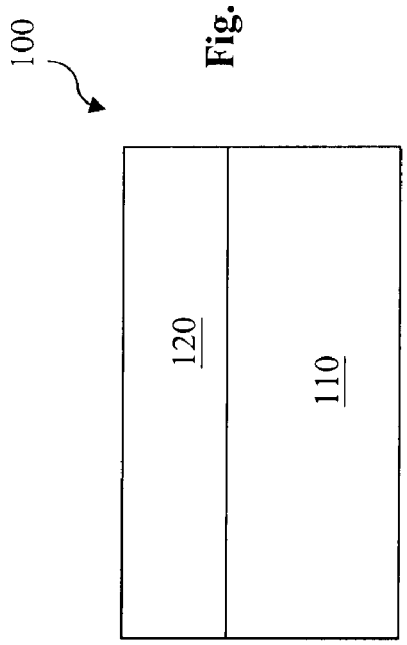

FIG. 1 discloses a semiconductor device 100 having a silicon substrate 110. The substrate 110 may alternatively be made of other suitable semiconductor material, including Ge, SiGe, or GaAs. Further, the substrate 110 may be made of other suitable elementary semiconductor such as diamond; suitable compound semiconductor such as silicon carbide, indium arsenide, and indium phosphide; suitable alloy semiconductor such as silicon germanium carbide, gallium arsenic phosphide, and gallium indium phosphide. The substrate 110 may include various doped regions, dielectric features, and multilevel interconnects. The substrate 110 may alternatively be a non-semiconductor material such as a glass substrate for thin-film-transistor liquid crystal display (TFT-LCD) devices, or fused quartz or calcium fluoride for photomask (mask or reticle).

An underlying material layer (or "under-material" layer or simply "material" layer) 120 is formed on the substrate 110. The material layer 120 may function as a hard mask and/or a bottom anti-reflective coating (BARC). The material layer has a thickness ranging between about 50 angstroms and 9000 angstroms in one embodiment. In another embodiment, the material layer 120 has a thickness ranging between about 1000 angstroms and 3500 angstroms. For example, the thickness of the under-material layer 120 can be about 500 angstroms. Further, the material layer 120 may include other parameters designed in proper ranges. In one embodiment, the material layer 120 has a refractive index ranging between about 1 and 3, and an extinction coefficient (absorption value) $\kappa$ ranging between about 0.01 and 1.0. For further example, the material layer 120 has a refractive index about 1.7 and an extinction coefficient about 0.5.

In the present embodiment, the material layer 120 includes an organic polymer. The material layer 120 may be substantially free of silicon and/or substantially free of hydroxyl groups and carboxyl groups. The material layer 120 may include a photoresist (or resist) either positive-type or negative-type, with or without photosensitive material. The material layer 120 may include a proper BARC material and may further have a top layer to cover the BARC material. The top layer may be about 50 angstroms thick and substantially free of hydroxyl groups and carboxyl groups. The material layer 120 may include conventional polymer material or resist material. For example, the material layer may be one of t-Butyloxycarbonyl (t-BOC) resist, acetal resist, and environmentally stabilized chemically amplified photoresist (ES-CAP) that are known in the art. For the material layer 120 made of polymeric material, the polymeric material may be cross-linked. For example, the polymeric material can be spin-on coated to the substrate 110 and then cross-linked using a baking process with temperature ranging between about 90 C and 300 C (or between about 100 C and 180 C in another example). The polymeric material may alternatively be not cross-linked, then the material layer 120 may use a solvent that is incapable of dissolving a resist layer formed above the under material layer 120. For example, the material layer 120 may use a butanol solvent.

Alternatively, the material layer 120 may use other suitable materials that are different from a protective layer to be formed above the material layer 120 to protect a resist pattern on the material layer 120. For example, the material layer 120 may include silicon nitride or silicon oxynitride that are different from a protective layer containing silicon oxide, in which the two layers have substantially different etching rates during an etching process.

Referring to FIG. 2, a patterned resist layer 130 is formed on the material 120. Resist layer 130 includes a plurality of openings such that the material layer 120 is uncovered within the openings. The openings of the resist layer 130 are configured according to a pre-designed pattern. For example, a plurality of trenches can be formed in the substrate according to the openings. The resist layer 130 may have a thickness ranging between about 50 angstroms and 5000 angstroms. In another example, the resist layer 130 may have a thickness ranging between about 500 angstroms and 2000 angstroms. The resist layer 130 can be a positive-type or a negative-type resist. For advanced semiconductor patterning using extreme ultra violet (EUV) radiation beam, the resist layer 130 may use chemical amplification (CA) resist. The patterned rest layer 130 is formed by a lithography process that may include processing steps of resist coating, soft baking, mask aligning, exposing, post-exposure baking, developing, and hard baking. For illustration, the exposing process may be carried out by exposing the semiconductor device 100 under a radiation beam through a mask having a predefined pattern (or a reversed pattern). The radiation beam may be ultra-violet (UV) or EUV such as 248 nm beam by Krypton Fluoride (KrF) excimer lasers or 193 nm beam by Argon Fluoride (ArF) excimer lasers. The lithography patterning may alternatively be implemented or replaced by other proper methods such as maskless lithography, electron-beam writing, ion-beam writing, and molecular imprint. The patterned resist layer 130 may include acid molecular or radiation-sensitive acid generator such that acid can be generated when a radiation beam is applied.

Figure 3:
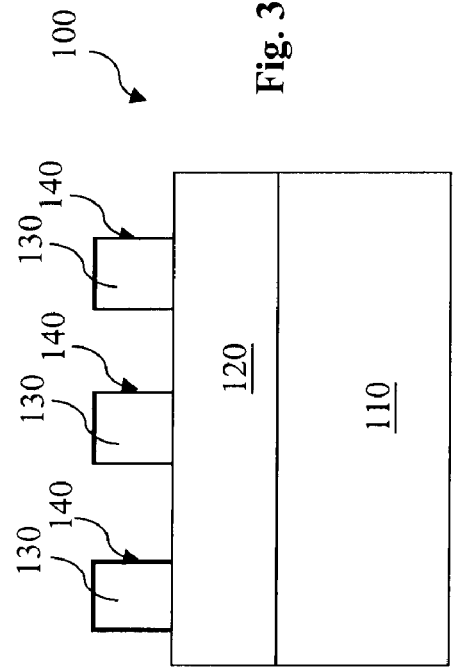

Referring to FIG. 3, a protective layer 140 is formed on the patterned resist layer 130. Protective layer 140 is disposed on the exposed surfaces of the patterned resist layer 130. For example, the protective layer is substantially conformal to the patterned resist layer 130 and covers the sidewalls and top surface thereof. In one embodiment, the protective layer 140 has a thickness ranging between about 5 angstroms and 100 angstroms and a higher etching resistance relative to the underlying material layer 120 (during a following etching process to open the material layer 120). The protective layer 140 may include silicon and may further include inorganic material that contains silicon oxide and/or organic polymeric material that contains silicon. The protective layer 140 may alternatively be formed inside the patterned resist layer (such as in a surface sheet of the resist layer). As mentioned before, the material of the under material layer 120 is chosen such that the protective layer is selectively formed on the resist layer.

In one embodiment, a silicon-containing polymer material is disposed on the patterned resist layer 130 and in the openings thereof, using a suitable process including spin-on coating. Then an acid in the resist layer is diffused into the polymeric material and induces the polymeric layer to be cross-linked, at room temperature or a raised temperature such as a temperature between about 25 C and 150 C. The un-crosslinked polymeric material is then removed by a rinse using de-ionized water, Tetramethylammonium hydroxide (TMAH), or other suitable fluid.

In another embodiment, silicon-containing material is deposited on and is reacted with the resist layer 130 by a chemical reaction or ionic reaction. The reaction may be initiated at room temperature or at a raised temperature such as a temperature ranging between about 25 C and 150 C. Then un-reacted polymeric material is removed by a rinse using de-ionized water or suitable fluid. For example, hydroxyl groups and/or carboxyl groups in the patterned resist may have reacted with hydroxyl groups and/or carboxyl groups in the polymeric material such that polymeric material at the interface is bonded to the resist layer 130. Since the under material layer 120 is free of the hydroxyl groups and carboxyl groups, the polymeric material is not able to be formed thereon. The exemplary material used to form the protective layer 140 may include $CH_3OSiOSiCh_3O$, $CH_3OSiOSiOSiCH_3O$, and/or $(CH_3O)_3SiOSi(CH_3O)_2OSi(CH_3O)_3$.

In another embodiment, small silicon-containing molecules is provided and diffused into the patterned resist layer 130. The small silicon-containing molecules have a molecular weight less than about 5000 daltons. The small molecules may be provided in a fluid or polymer matrix. Then polymer matrix or fluid is removed after the diffusion. As an example, $(CH_3O)_4Si$ is applied on using a spin-on coating and then is diffused to the resist layer 130.

Alternatively, the protective layer 140 may include titanium, titanium nitride, tantalum, aluminum, metal ion, metal complex, organic metal, or combinations thereof such that the protective layer is substantially different from the underlying material layer 120 in terms of etching rate and chemical/ionic reaction.

Figure 4:
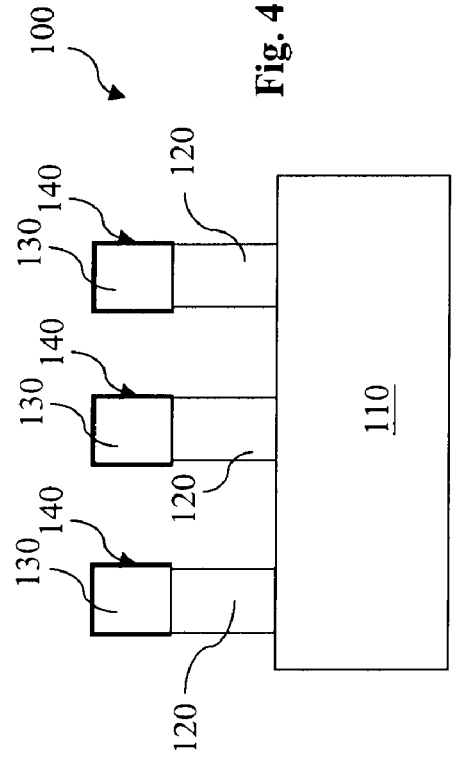

Referring to FIG. 4, plasma dry etching is applied to open the underlying material layer 120 such that the substrate 110 is exposed within the openings. The silicon-containing protective layer 140 reacts under the oxygen plasma to form silicon oxide that has a high etching resistance during the etching process. In another example, if the protective layer include titanium, titanium nitride, tantalum, aluminum, metal ion, metal complex, organic metal, or combination thereof, then metal oxide may be formed providing an etching resistance. The etching process may alternatively be implemented using a nitrogen plasma or a mixture of oxygen, hydrogen, carbon fluoride, carbon bromide and nitrogen plasma, during which the silicon-containing material in the protective layer is transformed into an associated nitride or oxynitride.

Referring to FIG. 5, the patterned resist layer 130 and the protective layer 140 may be removed by a conventional process. For example, the thin silicon skin protective layer may be consumed during the substrate etch, or the hydrofluorine (HF) solution may be used to remove the protective layer made of silicon oxide. Then the resist layer 130 is stripped. Alternatively, the removal of the both layers 130 and 140 may be skipped.

Referring to FIG. 6, the substrate 110 is opened under the patterned material layer 120 to form a plurality of trenches using a suitable etching process including a dry etching or a wet etching. The material layer 120 is thereafter removed.

Figure 7:
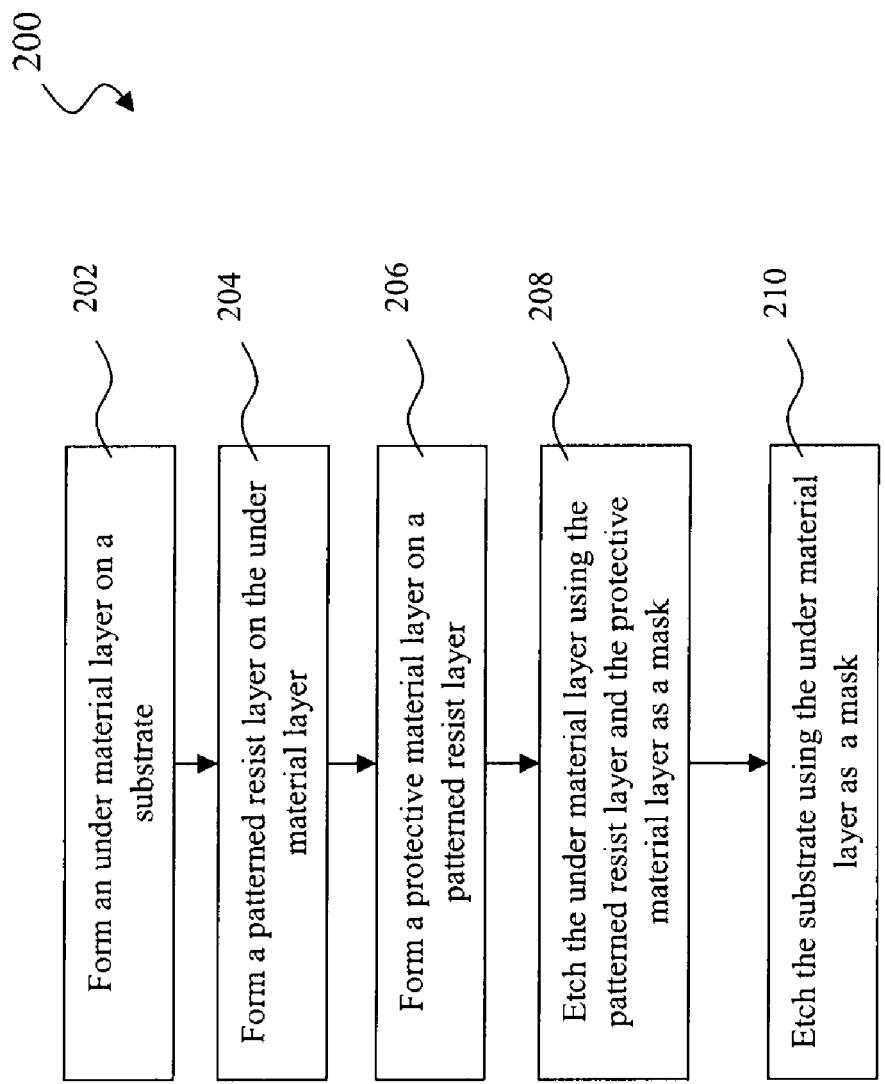
FIG. 7 is a flowchart of one embodiment of a method of lithography patterning.

FIG. 7 is a flowchart of an embodiment of a method 200 of lithography patterning as a further illustration of the lithography patterning described above with reference to FIGS. 1-6. The method 200 begins at step 202 by forming an underlying material layer on a substrate, and further includes step 204 to form a patterned resist layer on the underlying material layer. At step 206, a second material layer is formed on the patterned resist layer, and at step 208 the underlying material layer is etched using the patterned resist layer and the protective material layer as a mask. At step 210 the substrate is etched using the underlying material layer as a hard mask. Various changes, substitutions and alterations can be made herein without departing from the spirit and scope of the present disclosure.

Figure 8:
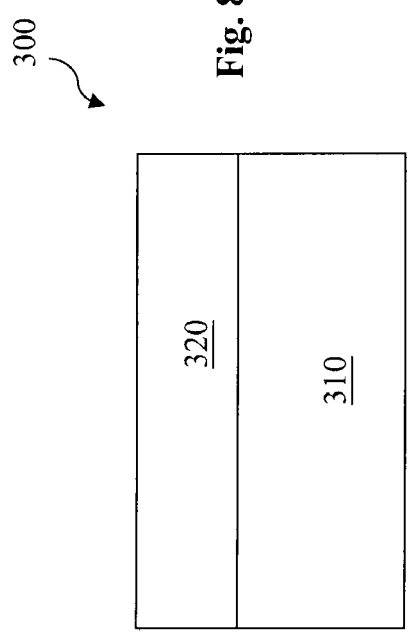

FIGS. 8 to 14 are sectional views of another embodiment of a substrate 300 to be patterned during various fabrication stages. With reference to FIGS. 8-14, a method for lithography patterning is described. FIG. 8 discloses a semiconductor device 300 having a silicon substrate 310. The substrate 310 may alternatively be made of other suitable material substantially similar to the substrate 110.

An underlying material layer 320 may be formed on the substrate 310. The material layer 320 is chosen such that it is substantially different from a hard mask layer formed above in terms of etching rate. In one example, the material layer 320 may include a material substantially similar to that of the material layer 120. The material layer 320 may include a multilayer structure. For example, the material layer 320 may include a first polymer layer and a second polymer layer disposed on the first polymer layer. The second polymer layer includes a radiation-sensitive material sensitive to the radiation beam of an exposure system including ultra-violet, extreme ultraviolet (EUV), or electron-beam.

Figure 9:
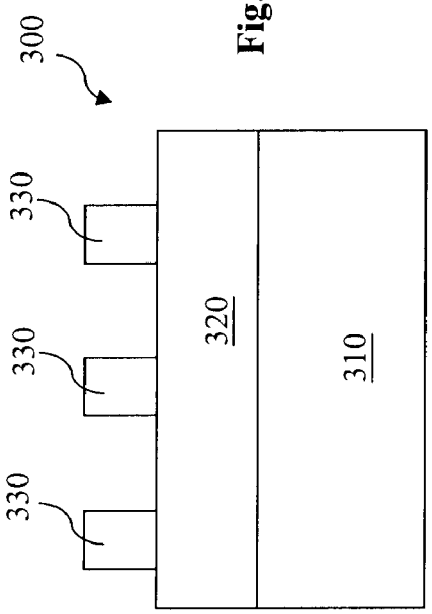

Referring to FIG. 9, a patterned resist layer 330 is formed on the underlying material 320. Resist layer 330 includes a plurality of openings such that the material layer 320 is uncovered within the openings. The patterned resist layer 330 may be substantially similar to the resist layer 130 discussed above, in terms of function, formation, configuration, and composition.

Figure 10:
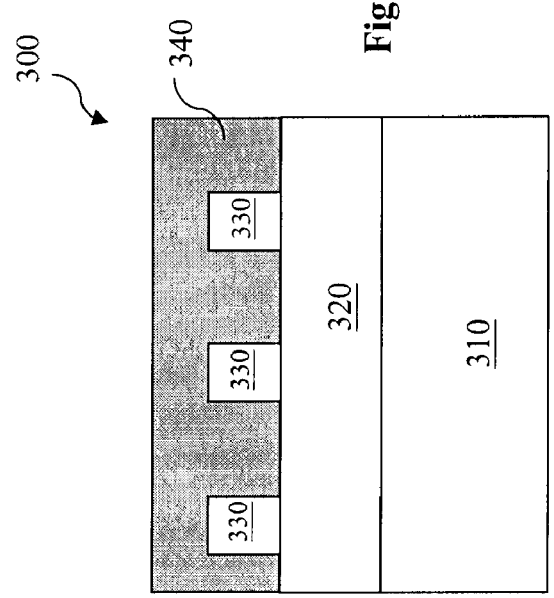

Referring to FIG. 10, a hard mask layer 340 is formed on the patterned resist layer 330 and in the openings thereof. The hard mask layer substantially fills in the openings of the patterned resist layer 330. Alternatively, the hard mask layer 340 may substantially cover the underlying material layer 320 exposed by the openings of the patterned resist layer 330. The hard mask layer 340 may include silicon-containing organic polymer, which may use a different solvent different from that of the resist layer. The solvent of the hard mask layer is incapable to dissolve the resist layer 330. For example, the hard mask can use butanol, isobutanol, isopentanol and/or IPA solvent. The polymeric material may be cross-linked. The hard mask layer 340 may include silicon-containing inorganic polymer. For example, the inorganic polymeric material may include silicon oxide. The hard mask layer may alternatively include metal-containing organic polymer material that contains metal such as titanium, titanium nitride, aluminum, and tantalum. In another embodiment, the hard mask layer 340 may include silicon nitride or silicon oxynitride. The hard mask layer 340 may include pure silicon such as polycrystalline silicon or silicon oxide. For example, the hard mask layer 340 may include spin-on glass (SOG) known in the art.

Figure 11:
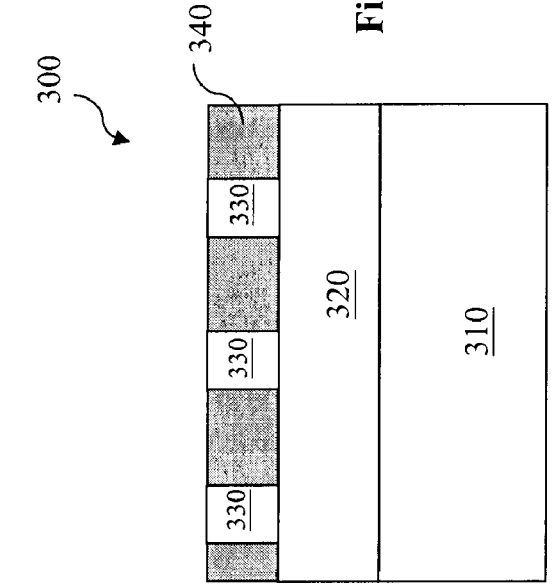

Referring to FIG. 11, an etching process is applied to etch back the hard mask layer such that the top surfaces of the patterned resist layer 330 are substantially exposed. The etch back process may use CF4 dry etch or buffered hydrofluoric acid (BHF) wet etch to etch silicon dioxide. Other proper process may be utilized to implement the etching back, such as chemical mechanical polishing (CMP).

Referring to FIG. 12, the patterned resist layer 330 may be removed by a conventional process including wet stripping and oxygen plasma stripping. Thus, a reversed hard mask pattern is formed, in which the openings within the hard mask layer 340 are covered by the pattern resist layer 330 before the removal of the resist layer 330. The reversed pattern of the hard mask layer 340 thus formed has various advantages. The hard mask pattern can be trimmed to reduce the widths of the hard mask island for realizing small feature sizes. For example, a wet etching with BHF etchant may be used to trim the patterned hard mask layer made of silicon oxide. In another example, another resist layer may be applied and patterned such that a trimming process may be performed to modify the hard mask pattern within particular regions, such as isolated trenches may be thus modified to eliminate an etching load effect. Alternatively, the patterned resist layer 330 may be removed along with next etching process to open the underlying material layer 320.

Referring to FIG. 13, an etching process is applied to open the underlying material layer 320 if the material layer 320 is formed on the substrate 310. The etching process is chosen such that the underlying material layer 320 has a higher etching rate relative to the etching rate of the hard mask layer 340. For example, if the underlying material 320 includes silicon nitride, and the hard mask 340 includes silicon oxide, a hot phosphoric acid (H3PO4) can be used to selectively remove the underlying material layer 320.

Referring to FIG. 14, another etching process is applied to open the substrate 310 under the patterned underlying material layer 320. The etching process is chosen such that the substrate 310 is selectively etched. In one embodiment, the hard mask layer 330 is removed before the etching of the substrate 310. In another embodiment, the hard mask layer 310 may be removed along with the material layer 320 after the etching of the substrate 310. In another embodiment, if the hard mask layer is directly disposed on the substrate 310, then the etching process is chosen such that the etchant has a higher etching rate to the substrate 310 relative to the hard mask layer 340.

Figure 15:
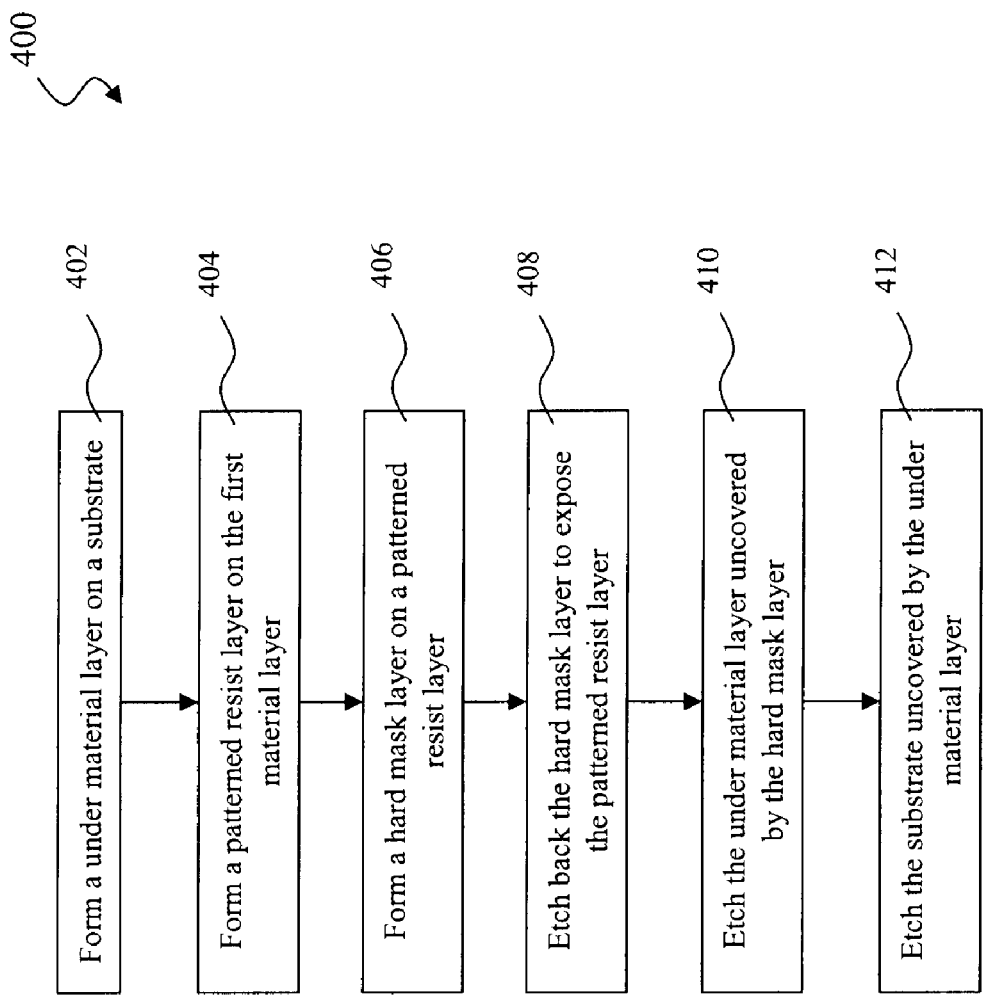
FIG. 15 is a flowchart of another embodiment of a method of lithography patterning.

FIG. 15 is a flowchart of an embodiment of a method 400 of lithography patterning as a further illustration of the lithography patterning described with respect to FIGS. 1-6. The method 400 begins at step 402 by forming an under material layer on a substrate, further includes step 404 to form a patterned resist layer on the underlying material layer, step 406 to form a hard mask layer on the patterned resist layer, step 408 to etch back the hard mask layer to expose the top surfaces of the patterned resist layer, step 410 to etch the underlying material layer exposed within the openings of the hard mask layer, and step 412 to etch the substrate exposed within the openings of the underlying material layer. The hard mask layer, the patterned resist layer, and the underlying material layer may be removed after a proper step as described with reference to FIGS. 8-14. As mentioned above, the under material layer may be alternatively avoided.

Thus the present disclosure provides a method of lithography patterning. The method includes forming a first material layer on a substrate, the first material layer being substantially free of silicon; forming a patterned resist layer including at least one opening therein above the first material layer; forming a second material layer on the patterned resist layer, the second material layer containing silicon; and opening the first material layer using the second material layer as a mask.

In this method, the opening of the first material layer may include a plasma etching. The plasma etching may include introducing oxygen plasma. The plasma etching may include introducing nitrogen plasma. The opening of the first material layer may include using the second material layer and the patterned resist layer protected by the second material as a mask. The method may further include opening the substrate using the first material layer as a hard mask. Forming the first material layer may include forming a material having a refractive index ranging between about 1 and 3, and an absorption value ranging between about 0.01 and 1. Forming the first material layer includes forming a polymeric material selected from the group consisting of organic polymer, resist, BARC, and combinations thereof. Forming the polymeric material layer may include cross-linking the polymeric material. The cross-linking the polymeric material may include a baking process with temperature ranging between about 90 C and 300 C. The first material layer may be substantially free of hydroxyl group and carboxyl group. The first material layer may includes butanol solvent. The first material layer may include acrylate polymer. The first material layer may include a t-butoxycarbonyl (t-BOC) group, acetal group, and environmentally stabilized chemically amplified photoresist (ES-CAP). Forming the first material layer may include forming the first material layer having a thickness ranging between about 50 angstrom and 9000 angstrom. Forming the patterned resist layer may include exposing the patterned resist layer utilizing a means selected from the group consisting of Krypton Fluoride (KrF) excimer laser, Argon Fluoride (ArF) excimer laser, extreme ultraviolet (EUV), imprint, electron-beam, and combinations thereof. Forming the second material layer may include forming the second material layer with a thickness ranging between about 5 and 100 angstrom. Forming the second material layer may include introducing silicon-containing molecules having molecular weight less than about 5000 daltons. The method may further include diffusing the silicon-containing molecules from the second material layer into the patterned resist layer. Forming the second material layer may include introducing a slurry having silicon oxide and diffusing the silicon oxide into the resist. The diffusing of the silicon oxide may include a thermal treatment with a temperature ranging between about 50 C and 180 C. Forming the second material layer may include cross-linking polymeric material. The cross-linking polymeric material may include diffusing acid from the patterned resist layer to the second material layer. The cross-linking polymeric material may include a baking process with temperature ranging between about 25 C and 150 C. Forming the second material layer may include a chemical reaction to bond a portion of the second material layer to the patterned resist layer. Forming the second material layer may include reacting a first functional group in the second material layer with a second functional group in the patterned resist layer, the first and the second functional group each being selected from a hydroxyl group and a carboxyl group. Forming the second material layer may include a ionic reaction to bond a portion of the second material layer to the patterned resist layer. The second material layer may include a material selected from the group consisting of tetraethylorthosilicate ($C_2H_5O)_4Si$, and methyl silicate ($CH_3O)_4Si$, Forming the second material layer may include introducing a material selected from the group consisting of resist material, polymeric material, liquid, gas, and combinations thereof. The method may further include a removal process to remove residues after forming of the second material layer. The removal process may include introducing a solution selected from Tetramethylammonium hydroxide (TMAH), solvent and de-ionized water. Forming the patterned resist layer may include introducing a solvent incapable of dissolving the first material layer. Forming the patterned resist layer may include introducing acid into the patterned resist layer. Forming the patterned resist layer may include introducing photoacid generator (PAG). The method may further include: etching back the second material layer to expose the patterned resist layer; and etching the first material layer uncovered by the second material layer. The etching back may include performing one of an etching process and chemical mechanic polishing (CMP). The method may further include removing the patterned resist layer after the etching back. Forming the first material layer may include forming a first polymer layer and then a second polymer layer, the second polymer layer being sensitive to a radiation energy of an exposure system. The radiation energy may be selected from KrF excimer laser, ArF excimer laser, extreme ultraviolet (EUV), and electron beam. The may further include trimming the second material layer using an etching process.

The present disclosure also provides another method of lithography patterning. The method includes: forming a first material layer on a substrate; forming a patterned resist layer including at least one opening therein above the first material layer; forming a second material layer on the patterned resist layer, the second material layer including a chemical unit selected from the group consisting of Si, Ti, TiN, Ta, Al, metal ion, metal complex, organic metal, and combinations thereof; and etching the first material layer uncovered by the patterned resist layer while the patterned resist layer is protected from etching by the second material layer. The method may further includes: removing the second material layer and the patterned resist layer after the etching of the first material layer; and etching the substrate using the first material layer as a hard mask. The etching of the first material layer may include plasma etchant selected from the group consisting of oxygen plasma, nitrogen plasma, hydrogen, alkyl halide, and combination thereof. The etching of the first material layer may include reacting the second material layer to form a etching-resistive material selected from the associated oxide, nitride, and oxynitride. Forming the second material layer may include a process selected from the group consisting of: chemical reacting the second material layer to the patterned resist layer; ionic bonding the second material layer to the patterned resist layer; cross-linking the second material layer; and diffusing the second material into the patterned resist layer. The cross-linking the second material layer may include diffusing acid from the patterned resist layer.

The present disclosure also provides a method. The method includes: forming a patterned resist layer including at least one opening therein on a substrate; forming a hard mask layer on the patterned resist layer; etching back the hard mask layer to expose the patterned resist layer; and etching the substrate uncovered by the hard mask layer. The method may further include removing the patterned resist layer before etching the substrate. The etching back of the hard mask layer may include a process selected from a dry etching, a wet etching, and combination thereof. The hard mask layer may include at least one of Ti, TiN, Al, and Ta. Forming the hard mask layer may include forming a material selected from the group consisting of silicon, silicon oxide, silicon nitride, silicon oxynitride, and combinations thereof. Forming the hard mask layer may include forming a silicon containing organic polymer. Forming the silicon containing organic polymer may include cross-linking the silicon containing organic polymer. Forming the hard mask layer may include forming a silicon containing inorganic polymer. The silicon containing inorganic polymer may include silicon oxide. Forming the hard mask layer may include a process selected from spin-on coating and chemical vapor deposition (CVD). The method may further include an etching process to trim the hard mask layer.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of lithography patterning, comprising:
    forming a first material layer on a substrate, the first material layer being substantially free of silicon;
    forming a patterned resist layer including at least one opening therein on the first material layer;
    forming a second material layer on the patterned resist layer, the second material layer containing silicon, wherein forming the second material layer includes introducing a slurry having silicon oxide and diffusing the silicon oxide into the resist; and
    opening the first material layer using the second material layer as a mask.

2. The method of claim 1, wherein the diffusing of the silicon oxide includes a thermal treatment with a temperature ranging between about 50 C and 180 C.

3. A method of lithography patterning, comprising:
    forming a first material layer on a substrate, the first material layer being substantially free at least one of carboxyl groups;
    forming a patterned resist layer including at least one opening therein above the first material layer, the patterned resist layer containing carboxyl groups;
    forming a second material layer on the patterned resist layer, the second material layer including of carboxyl groups;
    reacting the carboxyl groups of the second material layer with the carboxyl groups of the patterned resist layer; and
    etching the first material layer uncovered by the patterned resist layer while the patterned resist layer is protected from etching by the second material layer.

4. The method of claim 3, further comprising:
    removing un-reacted second material layer before the etching of the first material layer; and
    etching the substrate using the first material layer as a hard mask.

5. The method of claim 3, wherein the etching of the first material layer includes using a plasma etchant selected from the group consisting of oxygen plasma, nitrogen plasma, hydrogen, alkyl halide, and combination thereof.

6. The method of claim 3, wherein the reacting of the carboxyl groups of the second material layer with the carboxyl groups of the patterned resist layer comprises providing a reaction temperature ranging between about 25 C and about 150 C.

7. The method of claim 3, wherein the removing of un-reacted second material layer comprises rinsing the un-reacted second material layer with de-ionized.

8. The method of claim 3, further comprising trimming the second material layer using an etching process.

* * * * *